(12) United States Patent
Roderick

(10) Patent No.: US 6,353,206 B1
(45) Date of Patent: Mar. 5, 2002

(54) PLASMA SYSTEM WITH A BALANCED SOURCE

(75) Inventor: Craig A. Roderick, San Jose, CA (US)

(73) Assignee: Applied Materials, inc., Santa Clara, CA (US)

( * ) Notice: Subject to any disclaimer, the term of this patent is extended or adjusted under 35 U.S.C. 154(b) by 0 days.

(21) Appl. No.: 08/657,619

(22) Filed: May 30, 1996

(51) Int. Cl.[7] ............................................... B23K 10/00
(52) U.S. Cl. ........................... 219/171.52; 219/121.43; 219/121.52; 156/345; 315/111.51
(58) Field of Search ..................... 219/121.4, 121.43, 219/121.52; 156/345, 646.1, 643.1; 204/298.37, 298.38; 315/111.51

(56) References Cited

U.S. PATENT DOCUMENTS

| | | | |
|---|---|---|---|
| 5,280,154 A | * | 1/1994 | Cuomo et al. ......... 219/121.52 |
| 5,401,318 A | * | 3/1995 | Pearson ................ 118/723 AN |
| 5,401,350 A | | 3/1995 | Patrick et al. |
| 5,519,215 A | * | 5/1996 | Anderson et al. ........... 250/288 |
| 5,556,501 A | * | 9/1996 | Collins et al. .............. 156/345 |
| 5,578,130 A | * | 11/1996 | Hayashi et al. .......... 118/723 E |
| 5,587,038 A | * | 12/1996 | Cecchi et al. ................ 156/345 |

FOREIGN PATENT DOCUMENTS

| | | |
|---|---|---|
| EP | 0 520 519 A1 | 12/1992 |
| EP | 0 694 949 A2 | 1/1996 |

* cited by examiner

*Primary Examiner*—Mark Paschall
(74) *Attorney, Agent, or Firm*—Fish & Richardson

(57) ABSTRACT

A plasma system which is to be coupled to a power source, the plasma system including a chamber defining an internal cavity in which a plasma is generated during operation; a coil which during operation couples power from the power source into the plasma within the chamber, the coil having first and second terminals; a first capacitor which is coupled between the first terminal and a reference potential; and a second capacitor connected to the second terminal and through which the power source is coupled to the second terminal.

11 Claims, 4 Drawing Sheets

US 6,353,206 B1

PLASMA SYSTEM WITH A BALANCED SOURCE

BACKGROUND OF THE INVENTION

The invention relates to an inductively coupled or capacitively and inductively coupled source for a plasma processing system, such as, for example, a plasma processing system of the type used in the manufacture of electronic components.

Referring to FIG. 1, an inductive plasma source may consist of a single section inductor (e.g. a coil 10) within or adjacent to a vacuum chamber 12, which may be composed of dielectric, semiconducting, and/or conducting materials. Coil 10 transfers power to a gas or mixture of gases within vacuum chamber 12 that is held at a low absolute pressure. In a conventional system of this type, RF power is typically delivered to the coil through one terminal of coil 10 while the other terminal of coil 10 is connected through a capacitor 14 to ground.

In the general case, power is transferred into the chamber via electric field and magnetic field coupling. A plasma of ionized gas is induced in the chamber when the field strength developed by coil 10 is sufficient to excite many electrons beyond the ionization energy of one or more of the gas constituents. For an inductive plasma, the magnetic field provides the dominant mode of power transfer.

The magnetic field created in coil 10 is determined by the current through the coil and the mechanical design of the coil. Generally, for inductive plasma sources, it is desirable to achieve the maximum magnetic field and therefore the maximum coil current for a given input power level.

Inductive sources also have an electric field (capacitive) mode of coupling related to the inductor voltage, unless it is blocked by some mechanism such as a Faraday shield. The voltage across an inductor is defined by the generalization of Ohm's law applied to an element which may be considered a lumped inductance:

$$v = L\frac{di}{dt} \quad (1)$$

That is, the voltage across an inductance is proportional to the time rate of change of the current through the inductance. The constant of proportionality L is the value of the inductance, given in units of henries. Thus, the voltage gradient across an inductor is set by the mechanical factors which determine the inductance, the rate of change of current in the coil set by the spectrum of the driving function, and the maximum coil current.

Maximizing the coil magnetic field for a given power input depends upon two conflicting factors, namely, the current through the coil and the inductance of the coil. The inductance of a coil at a given frequency f can be written as follows: $z=j\omega L$, where z is a complex impedance, $j=(-1)^{1/2}$, $\omega=2\pi f$ (i.e., the radian frequency of the driving function), and L equals inductance. Since the impedance of a coil at a particular frequency is proportional to the inductance, a small inductance would maximize the current through the coil. However, the magnetic field in a coil is increased by increasing the inductance. The solution is to use the concept of circuit resonance such that the coil is part of a tuned circuit with the desired characteristics at the frequency of interest.

The principle of electrical resonance is based upon the energy storage capability of inductances and capacitances. The fact that energy storage in a capacitance is in an electric field, and energy storage in an inductance is in a magnetic field results in a 180° phase shift between voltages across each element in a series circuit, resulting in a low impedance across the circuit at resonance. In a parallel circuit at resonance, the currents through the elements are out of phase, resulting in a high impedance across the circuit. A combination of series and parallel elements can result in the desired impedance match of the source inductor to the driving generator for maximum current.

The inductor peak voltage relative to the plasma potential establishes an electric field in the plasma which may result in the acceleration of the charged species alternately toward and way from the inductor or the walls of the vacuum vessel. These species may impact and sputter the wall of the chamber resulting in physical damage in the form of pitting, which is generally referred to as worm-holing, reducing the life of expensive components. Sputtered material from the walls, or the wall itself, may also become involved in a chemical reaction which may influence chemical processes within the vacuum vessel, producing possibly undesirable results.

In addition, in conventionally designed systems there may be arcing between the high voltage terminal at the top of the coil and the grounded surfaces. The arcing problem may not be solvable by simply moving the high voltage side of the coil to the other terminal. That could merely move the arcing problem to the other end of the chamber where other ground metal surfaces exist close by. Moreover, such a significant alteration in the system (i.e., moving the high voltage terminal of the coil antenna) may alter the process environment in an unpredictable and undesired way.

Also, it may not be possible to solve the arcing problem by simply moving the high voltage terminal farther away from the silicon plate or the other grounded conductive parts. The electric field that is created in that region of the system is important plasma ignition. If the high voltage turn of the coil was moved farther away from the metal part, the electric field would be reduced and initiating the plasma would become more difficult.

SUMMARY OF THE INVENTION

The invention is a plasma processing system including, in its simplest form, a series circuit made up of a first capacitor, a second capacitor, and a coil (inductor) used to generate an inductive plasma in a vacuum vessel. The particular topology allows the voltage difference between each end of the inductor and the ground reference to be shifted. If the capacitors are variable capacitors, the amount of shift can be adjusted by varying the values of the capacitances. If the plasma potential is referenced to ground, the inductor voltage relative to the plasma potential may be controlled.

In general, in one aspect, the invention is a plasma system which is coupled to a high frequency power source. The plasma system includes a chamber defining an internal cavity in which a plasma is generated during operation; a coil which during operation couples power from the power source into the plasma within the chamber; a first capacitor through which a first terminal of the coil is coupled to a reference potential; and a second capacitor through which a second terminal of the coil is coupled to the power source.

Preferred embodiments include the following features. The coil is positioned outside of the internal cavity within the chamber. The power source operates at a frequency of f, the coil has an inductance of L when the plasma is present in the chamber, the first and second capacitors have capacitances of C1 and C2, respectively, the combination of the first and second capacitors and the coil forms a circuit characterized by a resonant frequency that is $(2\pi)^{-1}(LC)^{-\frac{1}{2}}$ where C is equal to:

$$\frac{1}{(C1)^{-1}+(C2)^{-1}},$$

and said resonant frequency is selected to be near f. In addition, the chamber includes a dome made of a dielectric or semiconductor material and the coil surrounds the outside of the dome. The plasma system further includes a matching network connected between the power source and the second capacitor. Also, the reference potential is a ground potential. Further, the second capacitor has first and second terminals and the second terminal of the second capacitor is connected to the second terminal of the coil and the plasma system includes a shunt capacitor connected between the first terminal of the second capacitor and a second reference potential (e.g. a ground potential).

Also in preferred embodiments, both the values of the first and second capacitors are selected to satisfy the following relationships:

$$C2 = \left(\frac{\rho}{\rho-1}\right)C$$

wherein $\rho>1$ and $C \approx (L\omega^2)^{-1}$, where L is an inductance of the coil with a plasma present and $\omega$ is a radian frequency of the power source. Furthermore, at least one of the first and second capacitors is a variable capacitor.

The invention keeps the voltage across the coil approximately the same as compared to the conventional approach but it enables the user to shift that voltage relative to ground potential.

This has been shown to be useful in eliminating worm holing in the dome near the high voltage terminal of the coil antenna. In other words, it offers a substantial benefit in terms of extending the life of the quartz domes that are used in etch chambers.

It has also been found to provide an additional way of controlling the physical and/or chemical reactions within the plasma chamber and thus giving the user further ability to tailor the process conditions to the particular needs of each application.

The invention significantly reduces likelihood of arcing to the grounded surfaces. It also reduces the voltage gradient between the plasma and the coil. This results in less bombardment of the quartz cylinder by ions that are generated during the processing. Thus, another direct benefit of the invention is a considerably longer life of the quartz cylinder, which can typically cost thousands of dollars.

Other advantages and features will become apparent from the following description of the preferred embodiment and from the claims.

BRIEF DESCRIPTION OF THE DRAWINGS

FIG. 5 is a plot of simulation results for a circuit of the type shown in FIG. 4a.

DESCRIPTION OF THE PREFERRED EMBODIMENTS

Figure 1:
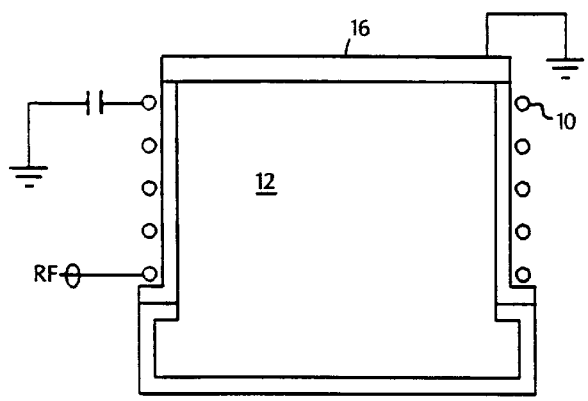
FIG. 1 is a schematic representation of a prior art plasma system.
Figure 2:
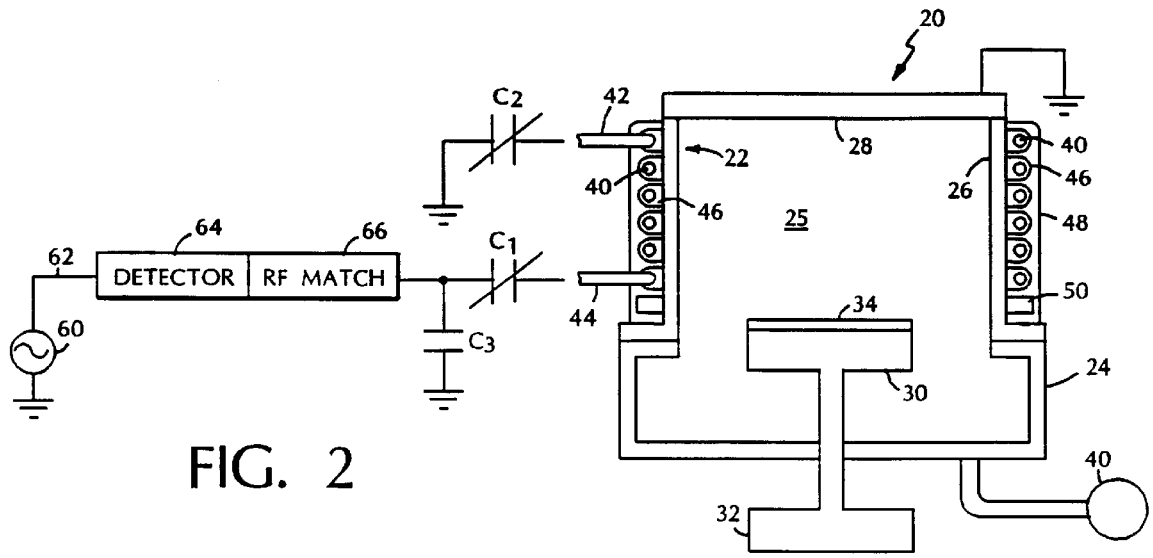
FIG. 2 is a schematic representation of a plasma system which embodies the invention.

The invention will be illustrated with reference to a high density etch system, a general schematic of which is shown in FIG. 2. Etch system 20 includes a dome 27 mounted onto a chamber body 10 to form a vacuum cavity 25 for holding a vacuum and in which a plasma may be generated. Dome 27 includes a cylindrical body 26 and a top plate 28. Cylindrical body 26 is typically made of quartz or some other dielectric or semiconductor material, which permits transmission of energy into the chamber. Top plate 28 is made of metal or semiconductor, e.g. aluminum or silicon, depending upon the type of process that will be performed in the system, although in some situations a dielectric is used for plate 28.

Within cavity 25, there is a pedestal 30 which can be raised and lowered by a lift mechanism 32 located beneath the chamber body. A substrate 34 (e.g. semiconductor wafer), which is to be etched, rests on top of pedestal 30.

There are, of course, many other components within the plasma system which are not shown in FIG. 2. For example, there is a vacuum pump for evacuating the chamber, sources of process gas, mass flow controllers, and programmable control circuitry, just to name a few of such components. Those components are well known to persons skilled in the art and need not be described here. It should be assumed, however, that such components as would produce a complete working system are present.

Surrounding the outside of cylindrical body 26 is a coil 40 which has at least two terminals, namely, an upper terminal 42 and a lower terminal 44. Coil 40 rests within grooves 46 that are formed in a cylindrical dielectric sleeve 48 which also surrounds cylindrical body 26. Grooves 46 mechanically support the turns of coil 40 and prevent them from moving relative to the plasma. Dielectric sleeve 48 also prevents arcing from occurring between turns of the coil 40. In the described embodiment, dielectric sleeve 48 is made of alumina or $Al_2O_3$.

It should be understood that coil is meant to encompass both lumped and distributed structures some of which might also be considered to be an antenna.

Near the bottom of dielectric sleeve 48, there is a heater 50 which is used during processing to indirectly heat the wall of cylindrical body 26 to an elevated temperature.

An RF generator 60 with a 50 ohms output impedance supplies RF power at MHz frequencies (e.g. 2 MHz) to coil 40 to initiate and maintain a plasma within the chamber during processing. RF generator 60 is connected through a coaxial RF cable 62 to an RF detector circuit 64 and an RF match section 66, both of which are typically mounted close to the chamber. The characteristic impedance of the coaxial cable 62 is also 50 ohms to match the output impedance of RF generator 60.

In general, RF match section 66 includes one or more variable reactive elements (e.g. inductors or capacitors) by which the impedance of the RF match section can be adjusted to achieve a match condition between RF cable 62 and coil 40 to thereby maximize the RF power that is delivered to the plasma within the chamber. RF detector circuit 64 monitors the power transfer into the coil 40 and generates therefrom control signals which adjust the values of the variable reactance elements within RF match section 66 to achieve and maintain a match condition.

The design and construction of both matching circuits and detector circuits are well known to persons skilled in the art. For example, Collins et al. describe a suitable match circuit in U.S. Pat. No. 5,187,454 and a suitable detector circuit in U.S. Pat. No. 5,392,018.

In accordance with one aspect of the invention, the RF signal is supplied to one terminal of coil 40 through a capacitor C1, while the other terminal of coil 40 is connected through a second capacitor C2 to a reference potential (e.g. ground), completing the electrical circuit. In the described embodiment, RF power is delivered through lower terminal 44 while upper terminal 42 is coupled to ground through capacitor C2.

Optionally, there is also a shunt capacitor Cs on the source side of the circuit, e.g. connected between the input side of capacitor C1 and ground. Shunt capacitor Cs, which in the described embodiment has a value of about 2000 pf, sets the impedance of the mismatched line and it acts to shift the impedance of coil 40 as seen by RF match circuit 66. Shunt capacitor Cs is chosen to reduce the mismatch.

By using series capacitors at both ends of the antenna (i.e., C1 and C2), instead of the single series capacitor at one end as is done in conventional systems, we are able to shift the maximum coil voltage relative to ground by an amount determined by the values of the capacitors that are used. Thus, we are able to reduce the voltage difference that occurs between ground and the high voltage side of antenna. One consequence of this is that it significantly reduces or eliminates the arcing problems that tend to occur at that location. In addition, if the capacitors are variable capacitors, we have the ability to control the size of the voltage shift and to thereby fine tune the electric fields and processing conditions within the chamber.

A more detailed explanation of the role of the two series capacitors C1 and C2 follows.

Figure 3:
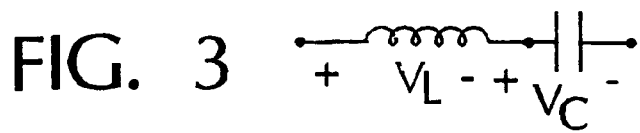
FIG. 3 is a simple series LC circuit.

First we will provide some preliminary analysis of a series resonant circuit. Perhaps the simplest illustration of a series resonant circuit is an inductance L in series with a capacitance C driven by a power source 31, as shown in FIG. 3. It is, of course, assumed that power source 31 includes a power generator connected to an impedance matching network. For clarity, we have also labeled the nodes as node 32, which is the driven node, and as node 35, which is the node that is shared by inductor L and capacitor C. If resistance is ignored, the circuit is resonant at the frequency f for which the complex impedances sum to zero:

$$j\omega L = \frac{-j}{\omega C} \qquad (2)$$

where $\omega = 2\pi f$;

$$f = \frac{1}{2\pi\sqrt{LC}} \qquad (3)$$

The voltage drop across the capacitor is given by:

$$V = \left(\frac{1}{C}\right)\int i(t)dt \qquad (4)$$

For a single radian frequency $\omega$ in the steady state and assuming that $i(t) = I \sin(\omega t)$, this becomes:

$$V_c = -\left(\frac{I}{\omega C}\right)\cos(\omega t) \qquad (5)$$

The voltage across the inductor is given by:

$$V_L = L\frac{di}{dt} \qquad (6)$$

For a single frequency, this becomes:

$$V_L = (I\omega L)\cos(\omega t) \qquad (7)$$

Thus, the two voltages are opposite in sign. Substituting $\omega L = 1/\omega C$, it is clear that the voltages are also equal in magnitude. Therefore, the voltage drops across the capacitance and inductance taken together add to zero, though the individual voltage drops across each element are not zero. In other words, in the ideal case, at series resonance, there is a virtual short across the resonant circuit.

Figure 4A:
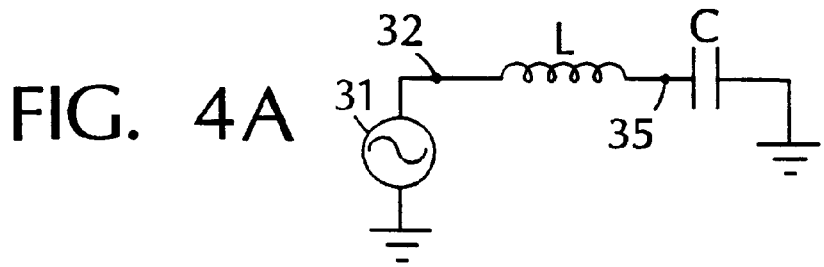
FIG. 4a is a simplified circuit diagram of an equivalent circuit of a conventional inductive source plasma system.

If one terminal of one of the elements is grounded, the voltage to ground at node 35, i.e., the node that is common to both inductor L and capacitor C, is given by the voltage across the grounded element. If we assume that one of the capacitor terminals is grounded, and the inductor terminal is driven, as shown in FIG. 4a, then, the voltage relative to ground at node 35 is given by:

$$V_c = -\left(\frac{I}{\omega C}\right)\cos(\omega t) \qquad (8)$$

Its peak values are $\pm I/\omega C$.

Figure 4B:
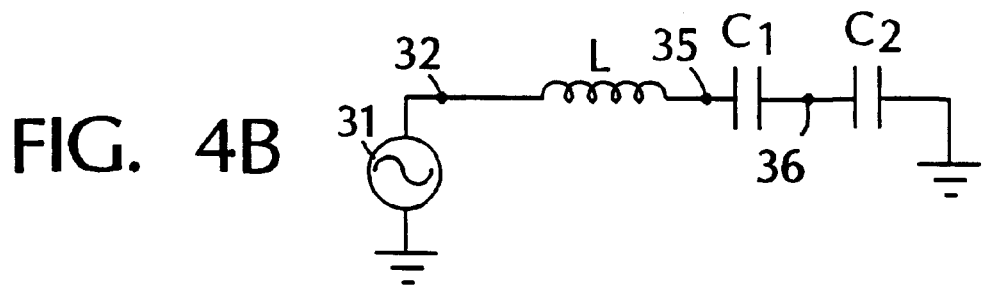
FIG. 4b is a circuit diagram showing the capacitor formed by two capacitors connected in series.

As shown in FIG. 4b, we can separate capacitance C into two series capacitances, C1 and C2, not necessarily equal, but with net series capacitance equal to the original C. Since the overall impedances do not change, there is no effect at driven node 32 nor at the other inductor node 35. A fraction of the total voltage drop across the original capacitor will be taken across each of the two capacitors, C1 and C2.

If the capacitor impedances are given by:

$$X_c = X_{c1} + X_{c2} \qquad (9a)$$

$$\frac{1}{C} = \frac{1}{C1} + \frac{1}{C2} \qquad (9b)$$

It can be shown that the relationship between the original capacitance and the two equivalent series capacitances is given by:

$$C1 = \rho C \qquad (10)$$

$$C2 = \left(\frac{\rho}{\rho-1}\right)C \qquad (11)$$

where $\rho$ is a real number greater than 1.

Therefore, the voltages across the capacitors become:

$$V_{C1} = \left(\frac{1}{\rho}\right)V_C \qquad (12)$$

$$V_{C2} = \left(\frac{\rho-1}{\rho}\right)V_C \qquad (13)$$

For linear circuits, the order of elements in a series network may be changed without affecting the voltage or current at the input to the network. Thus, we can change the circuit so that C1 is at the input, L is the middle component, and C2 is at the output, in the original position of C (see FIG. 4c). Note that the nodes have been relabeled: node 41 is the driven node to which C1 is connected, node 43 is common to both C1 and L, and node 45 is common to both L and C2.

The voltage relative to ground across C2, at node 45, is now:

$$V_{C2} = -\left(\frac{\rho-1}{\rho}\right)\left(\frac{I}{\omega C}\right)\cos(\omega t) \qquad (14)$$

This voltage is lower than the voltage at node 35 of the original circuit (see FIG. 4a) by some fraction that is dependent upon ρ.

Notice, however, that the voltage across the coil remains:

$$V_L = (I\omega L)\cos(\omega t) \qquad (15)$$

The voltage (relative to ground) at the input to the coil, i.e., node 43, is now $V_L + V_{c2}$, a net voltage that is higher than the original node 32 voltage but less than the original node 35 voltage (see FIG. 4a). The voltage across C1 is given by:

$$V_{C1} = 1\left(\frac{1}{\rho}\right)\left(\frac{I}{\omega C}\right)\cos(\omega t) \qquad (16)$$

Figure 4C:
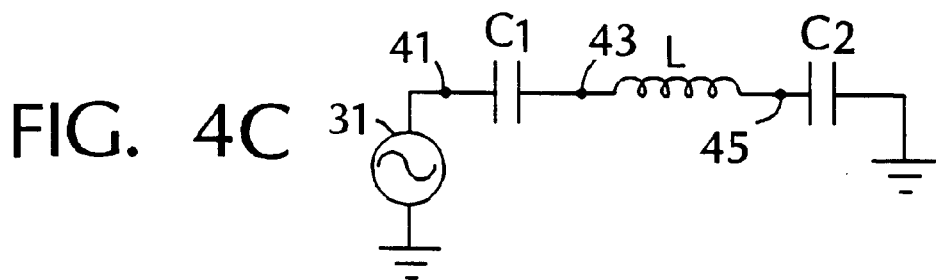
FIG. 4c is a simplified circuit diagram of an equivalent circuit of a plasma system in accordance with the invention.

Thus, as is expected, the voltages across the three elements add to a net zero voltage at node 41. But the voltage to ground at nodes 43 and 45 of the circuit of FIG. 4c are less than the voltage to ground at node 35 of the original circuit.

Figure 4D:
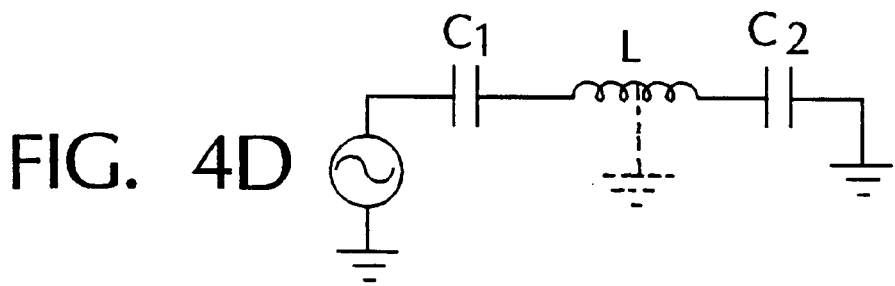
FIG. 4d is a circuit diagram showing the virtual grounds that are created by using two capacitors in a "balanced" configuration.

If ρ is 2, then the voltages at nodes 43 and 45 are equal and opposite, i.e., they are "balanced" evenly with respect to ground, thereby creating a virtual ground at the middle of the inductor (see FIG. 4d).

Other values of ρ will produce an uneven voltage "balance" and the virtual ground will not be at the middle of the inductor. This situation is analogous to the mechanical system of two weights, one at each end of a beam, which is set on a fulcrum. The balance point along the beam changes if one of the weights is changed.

The principles illustrated in the simplified explanation above are qualitatively correct even if the series equivalent impedance is not zero, and even if the circuit is near, but not at resonance. By "near", we mean that the input impedance of the series LC circuit exhibits a series equivalent impedance at ω with a phase angle φ that satisfies the following relationship: $-89° \leq \phi \leq +89°$.

Figure 5:
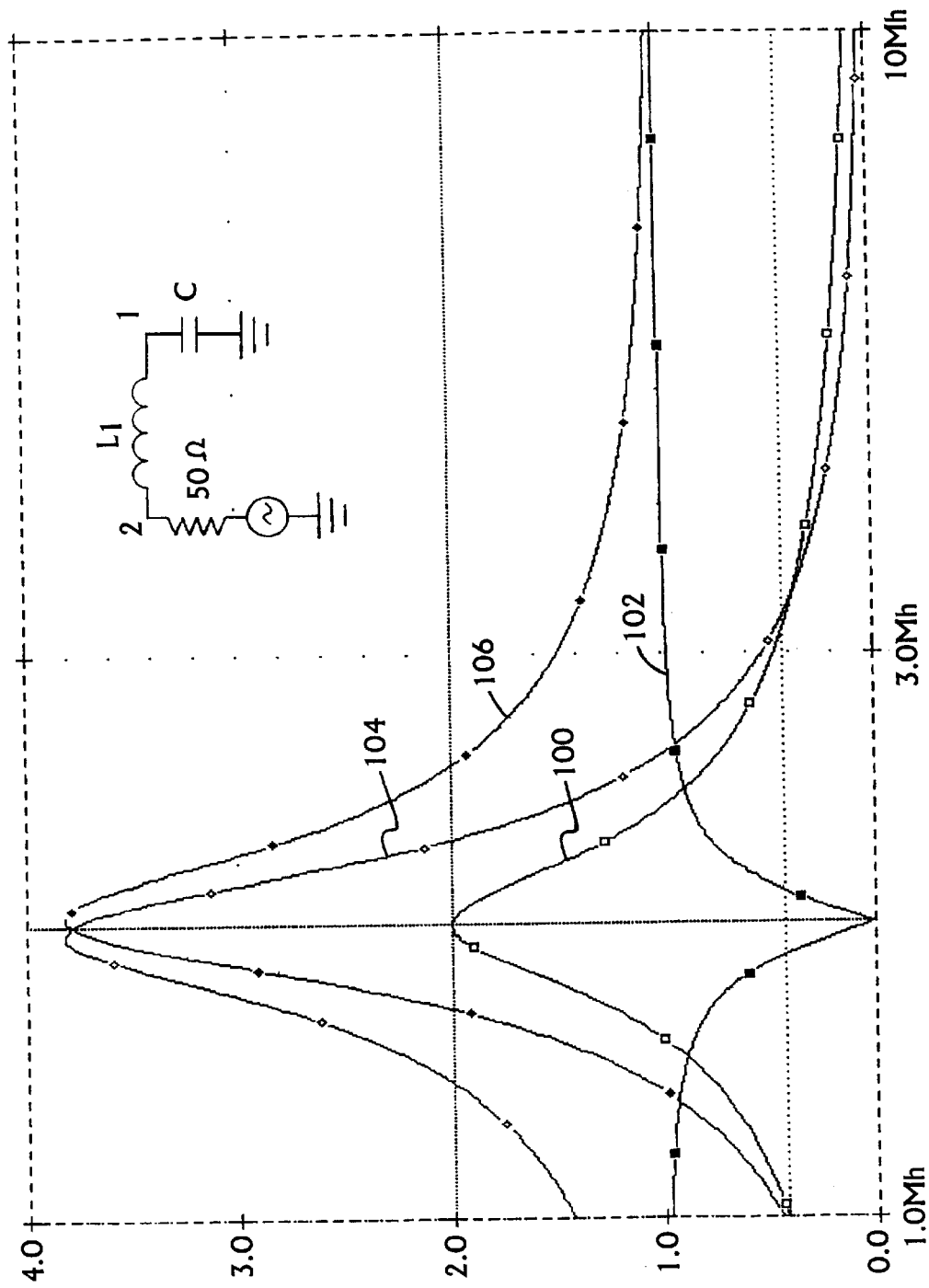
Figure 6:
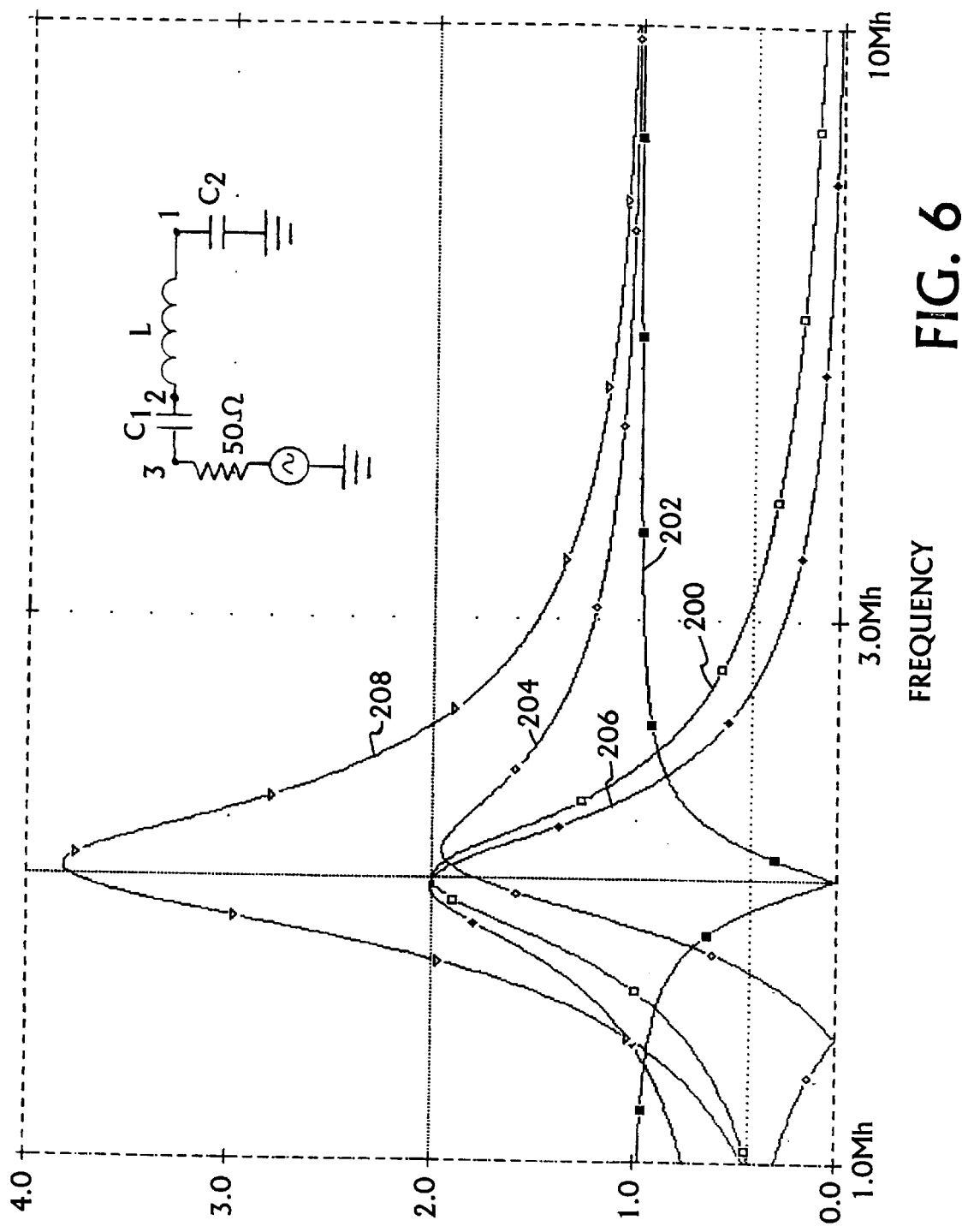
FIG. 6 is a plot of simulation results for a circuit of the type shown in FIG. 4c.

FIGS. 5 and 6, which plot simulation results, show a comparison of the simple LC circuit and the balanced circuit when a 50 ohm constant impedance source is used. The circuit which was simulated is shown in the inset of each of the figures and the nodes are identified. In the case of FIG. 5, which is the simple circuit of FIG. 4a, the values for the elements were as follows:

C=474 picofarads

L=17 μhenries.

In the case of FIG. 6, which is the balanced circuit of FIG. 4c, the values for the elements were as follows:

C1=1000 picofarads

C2=900 picofarads

L=17 μhenries.

In FIGS. 5 and 6, the curves are plotted as a function of the frequency of the RF signal. In FIG. 5:

curve 100 is a plot of $I_L$, the peak current through the coil;

curve 102 is a plot of V(2)/100, the peak voltage at the driven node 2;

curve 104 is V(1)/100, the peak voltage at shared node 1 (i.e., at the other end of the coil); and curve 106 is a plot of the peak value of {V(2)−V(1)}/100, the peak voltage difference across the coil.

In FIG. 6:

curve 200 is a plot of $I_L$, the peak current through the coil;

curve 202 is a plot of V(3)/100, the peak voltage at the driven node 2;

curve 204 is a plot of V(2)/100, the peak voltage at shared node 2;

curve 206 is V(1)/100, the peak voltage at shared node 1 (i.e., at the other end of the coil); and curve 208 is a plot of the peak value of {V(2)−V(1)}/100, the peak voltage difference across the coil.

Notice that the peak voltage across the coil remains the same for both circuits (compare curves 106 and 208) and the peak voltage at the drive node remains substantially the same (compare curves 102 and 202). However, note that in the case of the two capacitors, the peak voltages at both the input and output terminals of the coil are about one half the peak voltage observed at the shared node 1 in the circuit using the single capacitor.

In an inductive source, the plasma load impedance, which is a complex value, is reflected into the coil impedance. Another resistive term exists due to the resistance of the coil. In the real situation, currents and voltages do not peak at the same frequency, and voltages do not cancel. The output impedance of the source and matching network will also influence the voltages and currents. It is usually desirable to design the driving point node impedance such that a conjugate impedance match to the power source is possible using matching elements of practical size and loss. Since the inductor impedance is not generally known in advance, and is function of non-linear plasma conditions, the optimum values for C1 and C2 will generally be determined empirically from voltage measurements and design constraints. The approach may also be applied in the case of an inductor which acts as a distributed impedance, such as a coil or an antenna near self-resonance.

How the specific values of capacitors C1 and C2 are selected depends upon one's objectives. If the objective is to reduce the ion bombardment of the inside of the quartz dome, then the voltages on the coil antenna should be balanced so that a virtual ground exists at its midpoint. This would minimize the maximum voltage difference between the coil and the plasma.

The values of capacitors C1 and C2 will, of course, depend upon the impedance of the coil antenna. The circuit must operate close enough to series resonance to achieve high current and high voltage at the coil. In the real world, the acceptable value of the net series capacitance tends to lie in a fairly narrow range of values. Typically, however, the ideal capacitor value for the single capacitor case cannot be used as the value for the two series capacitors. Lowering the voltage of the inductor relative to the plasma changes the inductive coupling to the plasma and thus the optimum value of the net capacitance in the series LC circuit which produces resonance. In addition, because system characteristics vary slightly from one system to another, it is typically desirable to find by empirical means the optimum value of the net series capacitance for each system individually. Generally this can be done by first computing a starting value and then adjusting it to arrive at a value at which it is possible to initiate a plasma.

The empirical techniques for determining the optimum values of C1 and C2 are well known in the art. In general, variable capacitors are used (e.g. each variable capacitor may be implemented as a capacitor bank with both variable and fixed capacitors) and they are tuned to values expected to produce a tuned circuit at the operating frequency. The user then tries to initiate a plasma. The capacitor values are then readjusted until the attempts to ignite the plasma are successful. Once the plasma is initiated, of course, the matching circuit takes over and adjusts the system to resonance. Once the capacitor values are selected, they typically need not be changed. The values may be further adjusted to yield desired process results.

Another approach is to use low RF power, i.e., insufficient to initiate plasma, and then adjust the values of the capacitors to produce minimum reflected power from the chamber.

It should be understood that the invention can be used with any plasma system which uses a coil antenna or another type of antenna to couple power into the plasma. In addition, if a coil antenna is used, it need not be wound around the chamber as shown in FIG. 2. Instead, it could be positioned adjacent to a dielectric or semiconductor window into the chamber. Indeed, it could also be located within the chamber where it would achieve greater coupling to the plasma. Furthermore, the invention is not limited to using lumped coil or antenna elements. For example, it can be applied to a coil where its distributed aspects are important (e.g. where one might get a transmission line mode of operation). Also the capacitors may be lumped elements or distributed elements of equivalent impedance.

Though the operating frequencies of the described embodiment was described as being in the MHz range (e.g. 1–2 MHz), the invention can of course be used at other frequencies both below and above that range (e.g. microwave frequencies).

Also it should be understood that the invention can be used when coupling to a plasma through dielectric materials or semiconductors materials and it is independent of the form of the source. That is, implementations can include flat spiral coils, ribbon or "s" coils, helix coils, classical cylindrical coils, conical and spherical coils, bodies of rotation, multiple coils and elements, and straight elements, just to name some examples.

Other embodiments are within the following claims.

What is claimed is:

1. A plasma system which is coupled to a high frequency power source and which is used to process a substrate, said plasma system comprising:
   a chamber defining an internal cavity in which a plasma is generated during operation;
   a pedestal within said cavity and on which the substrate rests during operation;
   a coil which during operation couples power from the power source into the plasma within the chamber, said coil having first and second terminals;
   a first capacitor, wherein said first terminal is coupled to a reference potential through said first capacitor; and
   a second capacitor, wherein said second terminal is coupled to the power source through said second capacitor, wherein the power source operates at a frequency of f, wherein said coil has an inductance of L when the plasma is present in the chamber, wherein said first and second capacitors have capacitances of C1 and C2, respectively, wherein the combination of the first and second capacitors and the coil forms a circuit characterized by a resonant frequency that is $(2\pi)^{-1}(LC)^{-1/2}$ where C is equal to:

$$\frac{1}{(C1)^{-1} + (C2)^{-1}},$$

and wherein said resonant frequency is selected to be near f.

2. The plasma system of claim 1 wherein the coil is positioned outside of the internal cavity within the chamber.

3. The plasma system of claim 1 wherein said chamber comprises a dome made of a dielectric material and wherein the coil surrounds the outside of the dome.

4. The plasma system of claim 1 wherein said chamber comprises a dome made of a semiconductor material and wherein the coil surrounds the outside of the dome.

5. The plasma system of claim 1 further comprising a matching network connected between the power source and the second capacitor, the power from said power source passing through the matching network and through the second capacitor into the coil.

6. The plasma system of claim 1 wherein the reference potential is a ground potential.

7. The plasma system of claim 1 wherein the second capacitor has first and second terminals and wherein said second terminal of the second capacitor is connected to the second terminal of the coil and wherein said plasma system further comprises a shunt capacitor connected between the first terminal of the second capacitor and a second reference potential.

8. The plasma system of claim 7 wherein the second reference potential is a ground potential.

9. A plasma system which is coupled to a high frequency power source and which is used to process a substrate, said plasma system comprising:
   a chamber defining an internal cavity in which a plasma is generated during operation;
   a pedestal within said cavity and on which the substrate rests during operation;
   a coil which during operation couples power from the power source into the plasma within the chamber, said coil having first and second terminals;
   a first capacitor, wherein said first terminal is coupled to a reference potential through said first capacitor; and
   a second capacitor, wherein said second terminal is coupled to the power source through said second capacitor, wherein both the values of the first and second capacitors are selected to satisfy the following relationships:

$$C1 = \rho C$$

$$C2 = \left(\frac{\rho}{\rho - 1}\right) C$$

wherein $\rho > 1$ and $C = (L\omega^2)^{-1}$, where L is an inductance of the coil with a plasma present and $\omega$ is a radian frequency of the power source.

10. The plasma system of claim 1 wherein at least one of said first and second capacitors is a variable capacitor.

11. The plasma system of claim 9 wherein both the first and second capacitors are variable capacitors and wherein their values are adjusted to satisfy the following relationships:

$$C1 = \rho C$$

$$C2 = \left(\frac{\rho}{\rho-1}\right)C$$

wherein $\rho > 1$ and $C \approx (L\omega^2)^{-1}$, where L is an inductance of the coil with a plasma present and $\omega$ is a radian frequency of the power source.

* * * * *